United States Patent [19]

Meade

[11] 4,027,240
[45] May 31, 1977

[54] PROTECTED VOLTAGE METER

[75] Inventor: Robert C. Meade, Ridgecrest, Calif.

[73] Assignee: The United States of America as represented by the Secretary of the Navy, Washington, D.C.

[22] Filed: Oct. 20, 1975

[21] Appl. No.: 623,697

[52] U.S. Cl. .............................. 324/110; 321/45 R; 324/74; 324/119
[51] Int. Cl.² .................... G01R 1/36; G01R 19/22
[58] Field of Search ............... 324/119, 110, 74; 321/45 R, 47

[56] References Cited

UNITED STATES PATENTS

| 2,917,603 | 12/1959 | Leconte | 324/110 |
| 3,183,446 | 5/1965 | Richman | 324/110 |
| 3,339,080 | 8/1967 | Howald | 321/45 R |

FOREIGN PATENTS OR APPLICATIONS

| 878,802 | 10/1942 | France | 324/119 |
| 2,235,944 | 2/1973 | Germany | 324/132 |

Primary Examiner—Rudolph V. Rolinec
Assistant Examiner—Ernest F. Karlsen
Attorney, Agent, or Firm—R. S. Sciascia; Roy Miller; David J. Aston

[57] ABSTRACT

An electronic meter circuitry for use in detecting an electrical signal voltage in an ordnance firing circuit for providing an unidirectional signal to an indicator which shows the presence of the signal voltage. The circuitry utilizes a first limiter to reduce the amplitude of the detected signal to a predetermined level, a bridge rectifier to provide a unidirectional signal and a second limiter to prevent overloading the indicator. A self contained test circuit utilizing a current source and two current limiting resistors is supplied so proper operation of the meter circuitry prior to use may be readily ascertained.

2 Claims, 2 Drawing Figures

PROTECTED VOLTAGE METER

BACKGROUND OF THE INVENTION

In testing of ordnance firing circuits, extreme care must be taken to insure that the ordnance to be fired is not connected into a live firing circuit. This normally is accomplished by checking the firing circuit with a standard type voltmeter to insure that no signal voltage is present. While this method is adequate it is cumbersome, time consuming and in many cases can be subject to error depending on the skill of the operator, since to insure a properly operating meter it must first be checked. This is necessary since an inoperative meter may either fail to indicate the presence of a signal voltage or may introduce a signal voltage into the firing circuit. To properly check a standard meter requires that it first be compared with a known external signal source. Next, the meter is connected to the firing circuit, and operated from its high to low range in order to protect the meter and to insure that the minimum signal level required to detonate the ordnance is not present on the firing circuit prior to ordnance hookup. Finally, due to the design of most voltmeters only one polarity of DC or an AC signal may be measured in a given range setting. If this is the case it may then be discovered, when switching to the low ranges, that the polarity is reversed and the meter leads must be switched to determine if the minimum signal required for detonation is present.

In order to overcome these deficiencies it is desirable to have a meter circuitry which can be connected to an ordnance firing circuit and will detect and display the presence of any signal that can detonate the ordnance without regard to the polarity of the signal or without having to switch the meter range. In addition the meter incorporates a built-in test circuit to positively check the meter before its connection to the firing circuit to insure proper operation.

SUMMARY OF THE INVENTION

The present invention is directed to an apparatus for providing an indication of the presence of an electrical signal in ordnance firing circuits. The signal to be detected is reduced in amplitude by a diode limiter and inputted to a bridge rectifier where a unidirectional signal is outputted. This unidirectional output signal is further limited by a transistor limiter and then inputted to a meter to give an indication that a signal of sufficient amplitude to detonate ordnance, is present. Proper operation of the meter can be determined prior to its use by connecting an internal test circuit within the meter to its input terminals. This internal circuit provides a calibrated signal for indicating the presence of the test signal at the low end of the meter scale.

DETAILED DESCRIPTION OF AN EMBODIMENT OF THE INVENTION

Figure 1:
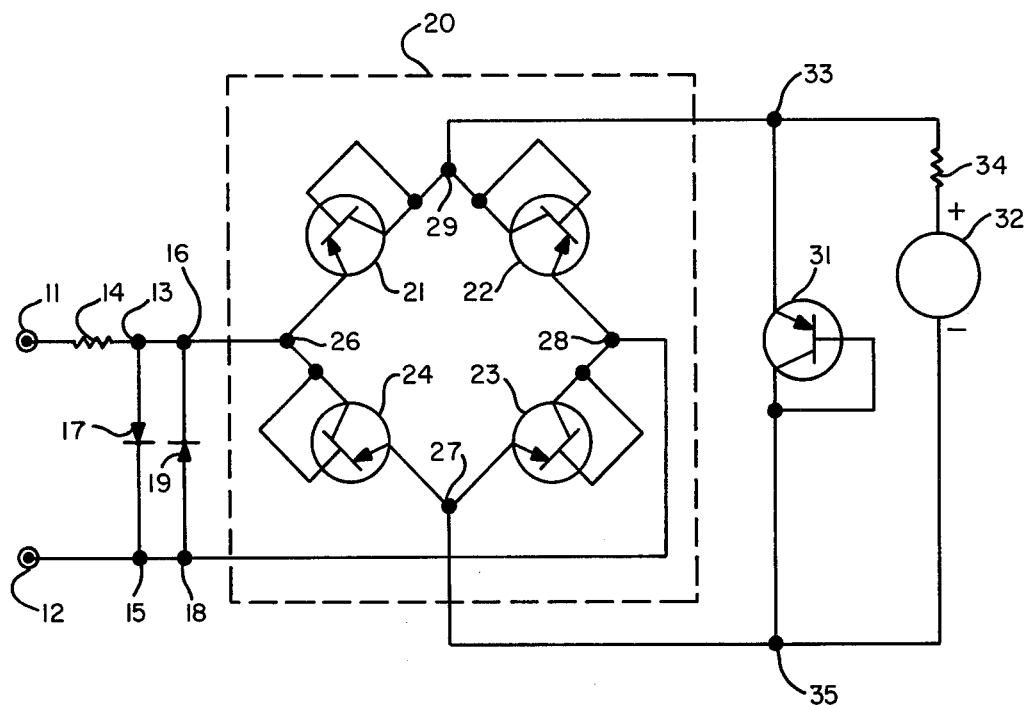
FIG. 1 is a schematic diagram of the meter circuit of the embodiment of the present invention.

Referring now to the drawing, more particularly to FIG. 1, the present invention is coupled to the ordnance circuit to be checked by two input binding posts 11, 12. Binding post 11 is connected to one lead of current limiting resistor 14 which has its other lead connected to junction 13. Binding post 12 is connected to junction 15.

A first limiter constructed of two back-to-back parallel-connected limiting diodes 17, 19 is connected from junction 13, 16 to junctions 15, 18. Junction 13 is connected, via junction 16, to a fullwave bridge recifier circuit 20 at junction 26 and junction 15 is connected, via junction 18, to the bridge rectifier circuit at junction 28.

The bridge rectifier circuit 20, as shown, has four transistors 21, 22, 23, 24 in diode-connected configuration in order to provide a lower signal loss than is presently obtainable with existing semiconducting diodes. In constructing the bridge circuit the emitter of transistor 21 is connected to junction 26 and its base and collector are connected to junction 29. Transistor 22 is connected to junction 29 at its base and collector and has its emitter electrically connected to junction 28. The base and collector of transistor 24 is connected to junction 26 and its emitter is connected to junction 27. The emitter of transistor 23 is connected to junction 27 and its base and collector are connected to junction 28.

A second limiter is constructed by coupling a diode-connected transistor across junctions 33 and 35 by connecting the emitter to junction 33 and the base and collector to junction 35. Junction 29 is connected via junction 33 to one side of a series network of load resistor 34 and meter 32. The negative side of meter 32 is coupled to junction 27 via junction 35.

All transistors are germanium alloy PNP type transistors.

Figure 2:
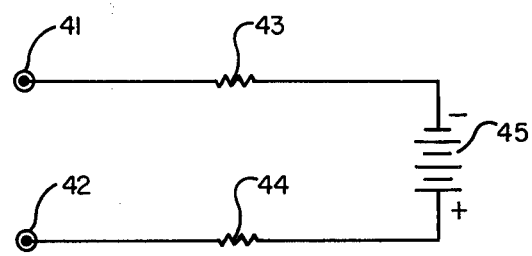
FIG. 2 is a schematic diagram of the test circuit of the embodiment of the present invention.

Referring now to FIG. 2, the test circuit has two output pin jacks 41, 42. Pin jack 41 is connected to one lead of a current limiting resistor 43 which has its second lead connected to a terminal of a battery 45. The remaining terminal of battery 45 is connected to one lead of current limiting resistor 44 which has its second lead connected to pin jack 42.

Values of current limiting resistors 43, 44 are selected which produced an output below the signal level required for ordnance detonation.

In operation, binding posts 11, 12 are connected to an ordnance firing circuit for coupling any signal present in the firing circuit through current limiting resistor 14 to junctions 13, 15. The limiting diode performing the limiting action will be determined by the polarity of the signal at junction 13 with respect to junction 15.

The limited signal is then coupled from junctions 13, 15 across the input junctions 26, 28 of bridge rectifier circuit 20. The polarity of the signal at junction 26 with respect to junction 28 will determine which two of the diode connected transistors will conduct thereby outputting a unidirectional signal across bridge rectifier circuit output junctions 27, 29. The unidirectional signal polarity at junction 29 will always be positive with respect to junction 27 irrespective of the polarity of the detected signal.

The unidirectional signal is then coupled from the bridge rectifier circuit 20 to junctions 33, 35 where the signal is further limited in amplitude by second limiter 31 and then inputted into the microammeter 32. The signal results in a meter reading which indicates a signal has been detected and reflects the approximate amplitude of the detected signal.

A resistor 34 is connected in series with microammeter 32 to prevent overloading the ammeter.

Prior to use of the meter circuit of FIG. 1, the pin jacks 41, 42 are connected to binding posts 11, 12. The battery 45 output is coupled through current limiting resistors 43, 44 and pin jacks 41, 42 into the meter circuit. Current limiting resistors 43, 44 reduce the amplitude of battery 45 output to a predetermined signal level and this signal is coupled through the meter circuit into microammeter 32.

A microammeter 32 reading of a predetermined value indicates the meter circuit is operating correctly. The test circuit is then disconnected from the meter circuit and the no-voltage meter is ready for operational use.

What is claimed is:

1. A device for measuring an A.C. or D.C. input signal regardless of polarity comprising:
   input terminals;
   a first limiter consisting of two diodes, each connected in parallel and in opposite directions of conductance across the input terminals for limiting amplitude of the input signal;
   a full-wave bridge rectifier of diode-coupled transistors connected to said first limiter;
   a second limiter receiving output from the rectifier for protecting a microammeter and consisting of a diode-coupled transistor connected in parallel with said microammeter;
   a microammeter connected in parallel with the second limiter, said microammeter operating within current ranges defined by the first and second limiters whereby small currents are registered and large currents do not damage the microammeter; and
   a source of low current test signal connected to said input terminals when testing said device but otherwise electrically insulated from the device.

2. The device of claim 1 further comprising a resistor connected in series with said microammeter to prevent overloading the microammeter.

* * * * *